(12) United States Patent
Hastings et al.

(10) Patent No.: US 11,405,056 B2
(45) Date of Patent: Aug. 2, 2022

(54) MAGIC STATE DISTILLATION USING INNER AND OUTER ERROR CORRECTING CODES

(71) Applicant: Microsoft Technology Licensing, LLC, Redmond, WA (US)

(72) Inventors: Matthew Benjamin Hastings, Seattle, WA (US); Jeongwan Haah, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 121 days.

(21) Appl. No.: 16/870,988

(22) Filed: May 10, 2020

(65) Prior Publication Data

US 2021/0351795 A1    Nov. 11, 2021

(51) Int. Cl.
*H03M 13/00* (2006.01)
*H03M 13/29* (2006.01)
*G06N 10/00* (2022.01)

(52) U.S. Cl.
CPC ........ *H03M 13/2906* (2013.01); *G06N 10/00* (2019.01)

(58) Field of Classification Search
CPC ............ H03M 13/2909; H03M 13/611; G06N 99/002
See application file for complete search history.

(56) References Cited

U.S. PATENT DOCUMENTS 10,404,287 B2 * 9/2019 Haah .................. H03M 13/033
11,038,537 B2 * 6/2021 Haah ................. H03M 13/2906

OTHER PUBLICATIONS

Aliferis, et al., "Quantum Accuracy Threshold for Concatenated Distance-3 Codes", In Journal of Quantum Information and Computation, vol. 6, Issue 2, Apr. 28, 2005, 58 Pages.
Bravyi, et al., "Magic State Disillation with Low Overhead", In Repository of arXiv:1209.2426, Sep. 11, 2012, 11 Pages.
Bravyi, et al., "Universal Quantum Computation with ideal Clifford gates and noisy ancillas". In Repository of arXiv:quant-ph/0403025, Dec. 16, 2004, 15 Pages.
Campbell, et al., "A Unified Framework for Magic State Distillation and Multiqubit Gate-Synthesis with Reduced Resource Cost", In Repository of arXiv:1606.01904, Jan. 23, 2017, 23 Pages.
(Continued)

*Primary Examiner* — Samir W Rizk
(74) *Attorney, Agent, or Firm* — Alleman Hall Creasman & Tuttle LLP

(57) ABSTRACT

Examples are disclosed that relate to, on a quantum computing device, distilling magic states encoded in a [[n,k,d]] block code comprising an outer code. One example provides a method comprising preparing encoded noisy magic states using data qubits, and measuring Clifford stabilizers on the data qubits, thereby applying an inner code. The method further comprises initializing output qubits and initiating a teleportation of distilled magic states derived from the encoded noisy magic states to the output qubits. The method further comprises measuring X-stabilizers on the data qubits, postselecting based on the outcomes, measuring each data qubit destructively utilizing Z-stabilizers, and applying one or more postselection conditions to the data qubits to complete the teleportation of the distilled magic states to the output qubits.

20 Claims, 7 Drawing Sheets

(56) References Cited

OTHER PUBLICATIONS

Chamberland, et al., "Fault-tolerant Magic State Preparation with Flag Qubits", In Journal of Quantum, vol. 3, May 16, 2019, 26 Pages.

Chamberland, et al., "Very Low Overhead Fault-Tolerant Magic State Preparation using Redundant Ancilla Encoding and Flag Qubits", In Repository of arXiv:2003.03049, Mar. 6, 2020, 27 Pages.

Eastin, Bryan, "Distilling one-qubit Magic States into Toffoli States", In Repository of arXiv:1212.4872, Feb. 21, 2013, 8 Pages.

Fowler, et al., "Low Overhead Quantum Computation Using Lattice Surgery", In Repository of arXiv:1808.06709, Aug. 30, 2019, 15 Pages.

Haah, et al., "Codes and Protocols for Distilling T, controlled-S, and Toffoli Gates", In Repository of arXiv:1709.02832, May 30, 2018, 29 Pages.

Haah, et al., "Magic State Distillation with Low Space Overhead and Optimal Asymptotic Input Count", In Repository of arXiv:1703.07847v1, Mar. 22, 2017, 48 Pages.

Haah, Jeongwan, "Towers of Generalized Divisible Quantum Codes", In Repository of arXiv:1709.08658, Apr. 5, 2018, 26 Pages.

Jones, Cody, "Multilevel Distillation of Magic States for Quantum Computing", In Repository of arXiv:1210.3388, Mar. 27, 2013, 10 Pages.

Jones, Cody, "Novel Constructions for the Fault-Tolerant Toffoli Gate", In Repository of arXiv:1212.5069, Dec. 20, 2012, 5 Pages.

Karzig, et al., "Scalable Designs for Quasiparticle-Poisoning-Protected Topological Quantum Computation with Majorana Zero Modes", In Repository of arXiv: 1610.05289, Jun. 21, 2017, 34 Pages.

Knill, Emanuel, "Fault-tolerant Postselected Quantum Computation: Schemes", In Repository of arXiv:quant-ph/0402171, Feb. 23, 2004, 17 Pages.

Knill, Emanuel, "Fault-Tolerant Postselected Quantum Computation: Threshold Analysis", In Repository of arXiv:quant-ph/0404104, Apr. 19, 2004, 21 Pages.

Litinski, Daniel, "Magic State Distillation: Not as Costly as You Think", In Repository of arXiv:1905.06903, Nov. 6, 2019, 22 Pages.

"Application as Filed in U.S. Appl. No. 16/856,274", filed Apr. 23, 2020, 45 Pages.

"International Search Report and Written Opinion Issued in PCT Application No. PCT/US2021/017326", dated Jun. 18, 2021, 28 Pages.

* cited by examiner

MAGIC STATE DISTILLATION USING INNER AND OUTER ERROR CORRECTING CODES

BACKGROUND

Quantum computers exploit superposition and entanglement of quantum states to perform quantum computations. Quantum states provide a probability distribution of an observable. A qubit holds the information regarding the probability distribution of a single state. Quantum computations are performed using qubits and application of logical operations on the qubits. Universal quantum computation may be enabled via high accuracy Clifford operations in combination with quantum states known as magic states.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

Examples are disclosed that relate to, on a quantum computing device, distilling magic states encoded in a [[n,k,d]] block code comprising an outer code. One example provides a method comprising preparing encoded noisy magic states using data qubits, and measuring Clifford stabilizers on the data qubits, thereby applying an inner code. The method further comprises initializing output qubits and initiating a teleportation of distilled magic states derived from the encoded noisy magic states to the output qubits. The method further comprises measuring X-stabilizers on the data qubits, postselecting based on the outcomes, measuring each data qubit destructively utilizing Z-stabilizers, and applying one or more postselection conditions to the data qubits to complete the teleportation of the distilled magic states to the output qubits.

DETAILED DESCRIPTION

Many schemes for quantum computation rely on first implementing a set of operations called the Clifford operations to high accuracy. To implement universal quantum computation, it is necessary to implement additional operations, such as a T gate or CCZ gate. Unavoidably, there will be some error in both the Clifford operations and the T gates. A large-scale, fault-tolerant quantum computer thus relies on various error correcting codes. Essentially, to achieve fault tolerance, errors must be corrected faster than they are produced. In the case of universal quantum computing via Clifford operations, two types of error correction are performed. Error correcting codes are used to build Clifford gates, and additional error correcting codes are used to produce T gates to high accuracy.

Error correction is performed on quantum states that have been encoded with redundancy. Rather than measuring a single qubit, parity checks are performed across multiple qubits to detect X-errors, or bit-flip errors, and Z-errors, or phase flip errors. Reduction in error in the Clifford operations may be performed using quantum error correcting codes of the stabilizer type, which is referred to herein as "inner code." To reduce error in the T gates, assuming that the Clifford operations are highly error-free, a method called magic state distillation may be used, which also uses error correcting codes, referred to herein as "outer code." Combined, these error correcting codes can impose a large overhead on a quantum computer.

Accordingly, examples are disclosed for magic state distillation utilizing an outermost code as a full quantum error correcting code. The distillation code may be used to stabilize the Clifford gates, thereby reducing the necessary overhead for the Clifford gates. Example distillation protocols are disclosed for distilling noisy T states into high-fidelity T or CCZ magic states. In some examples, the protocols are tailored implementations of known abstract error correcting codes.

In some examples, the distillation protocols are based on the idea of measuring the Clifford (not Pauli) stabilizer of T states (See, e.g., E. Knill, 2004, arXiv.quant-ph/0402171v1; E. Knill, 2004 arXiv:quant-ph/0404104v1, hereinafter Knill; P. Aliferis, D. Gottesmann, J. Preskill, Quant. Inf. Comput. 6, 97-165, 2006, arXiv:quant-ph/0504218; and J. Haah, M. Hastings, D. Poulin, D. Wecker, Quantum 1, 31, 2017, arXiv:1703.07847v1). In other examples of CCZ distillation protocols, the protocol may used a generalization (E. T. Campbell and M. Howard, Phys. Rev. A 95, 022316, 2017, arXiv:1209.2426, hereinafter Campbell) of triorthogonal codes (see, e.g., S. Bravyi and J. Haah, "Magic-state distillation with low overhead," Phys. Rev. A 86, 052329, 2012, hereinafter, Bravi).

Figure 1:
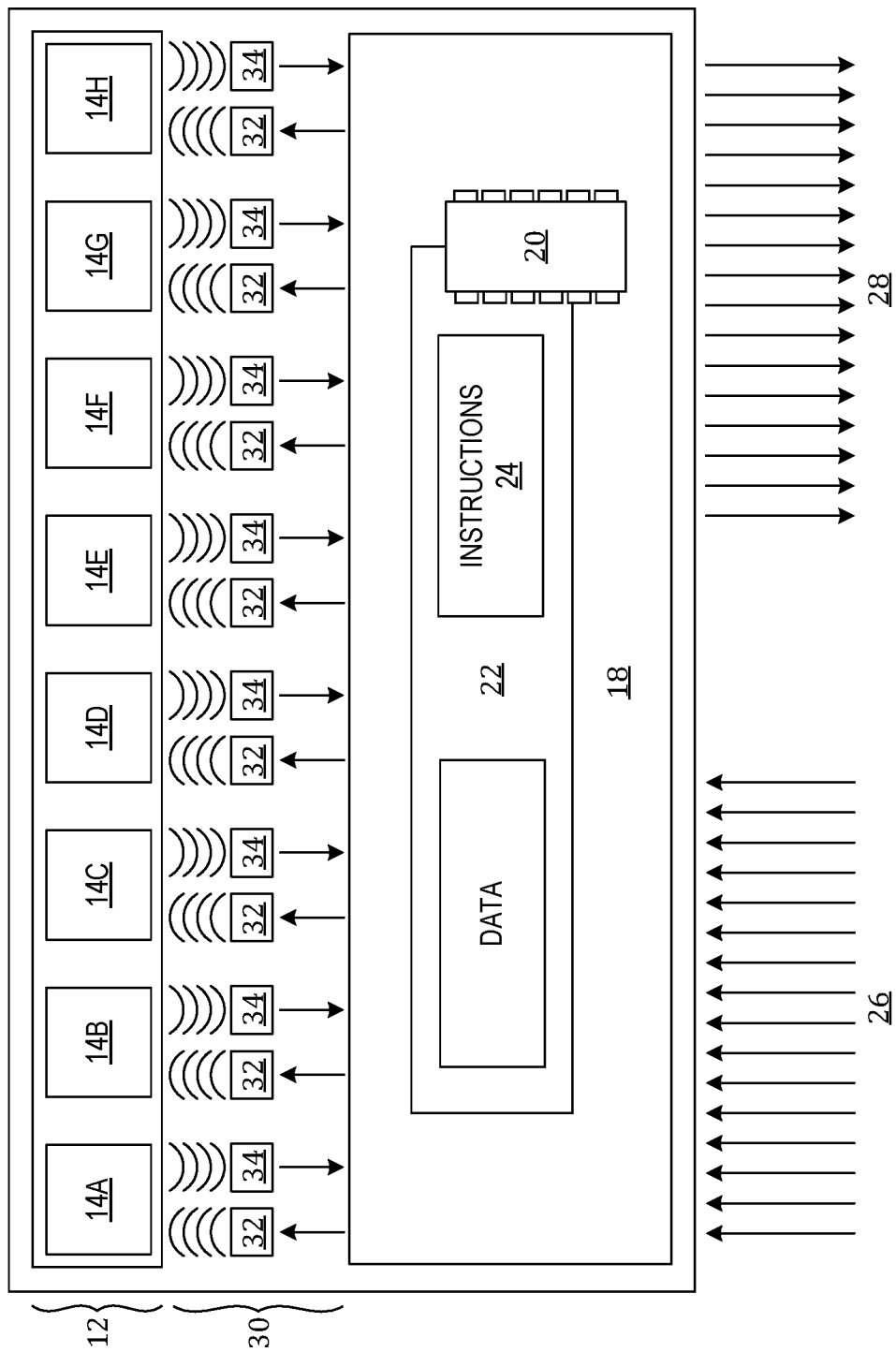
FIG. 1 schematically shows an example quantum computer.

Before discussing magic state distillation, some aspects of a quantum computer architecture are discussed. FIG. 1 shows some aspects of an example quantum computer 10 configured to execute quantum-logic operations. Quantum computer 10 includes at least one qubit register 12 comprising an array of qubits 14. The illustrated qubit register is eight qubits in length. It will be appreciated that other example quantum computers may comprise longer and shorter qubit registers and may comprise two or more qubit registers of any appropriate length.

Qubits 14 of qubit register 12 may take various forms, depending on the desired architecture of quantum computer 10. As examples, each qubit may comprise a superconducting Josephson junction, a trapped ion, a trapped atom coupled to a high-finesse cavity, an atom or molecule confined within a fullerene, an ion or neutral dopant atom confined within a host lattice, a quantum dot exhibiting discrete spatial or spin electronic states, electron holes in semiconductor junctions entrained via an electrostatic trap, a coupled quantum wire pair, an atomic nucleus addressable by magnetic resonance, a Majorana fermion, a free electron in He, a molecular magnet, or a metal-like carbon nanosphere. In general, each qubit 14 may comprise any particle or system of particles that can exist in two or more discrete quantum states that can be measured and manipulated experimentally. For example, a qubit may be implemented in the plural processing states corresponding to different modes of light propagation through linear optical elements (e.g. mirrors, beam splitters and phase shifters), as well as in states accumulated within a Bose-Einstein condensate. Quantum computer 10 may comprise suitable hardware to host qubits 14. For example, Majorana wires may host Majorana fermions.

Figure 2:
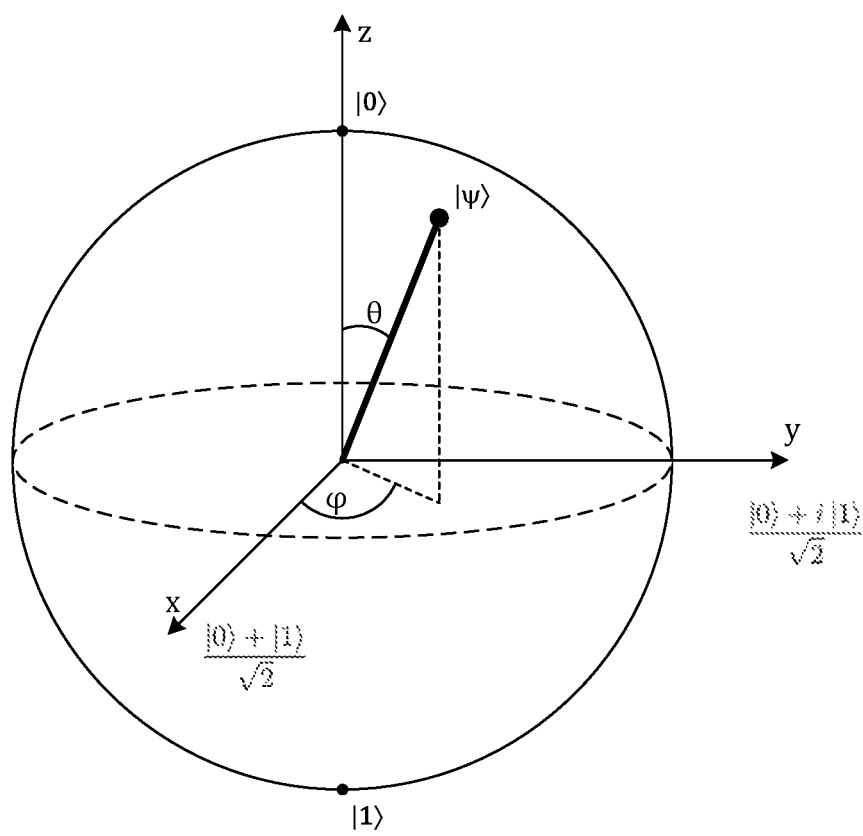
FIG. 2 illustrates a Bloch sphere, which graphically represents the quantum state of a qubit of a quantum computer.

The quantum state of a qubit may be represented on a Bloch sphere 200, as depicted in FIG. 2. The set of points on the surface of the Bloch sphere comprise all possible pure states $|\psi\rangle$ of the qubit, while the interior points correspond to all possible mixed states. The north and south poles of Bloch sphere 200 correspond to the standard basis vectors $|0\rangle$ and $|1\rangle$, respectively. For example, these basis vectors may represent up and down spin states of an electron or other fermion. A mixed state is any state that can be described as a mix of pure states. Mixed states may result from decoherence, which may occur because of undesirable coupling to external degrees of freedom. Quantum operations as implemented via quantum logic gates described herein are equivalent to a rotation or series of rotations about an axis of the Bloch sphere. For example, the Pauli-X gate is equivalent to a rotation around the X-axis of the Bloch sphere by $\pi$ radians.

The quantum states and operations discussed herein include:

$X=|1\rangle\langle 0|+|0\rangle\langle 1|$ $Z=|0\rangle\langle 0|-|1\rangle\langle 1|$ $T=|0\rangle\langle |+e^{i\pi/4}|1\rangle\rangle\langle 1|$ $S=T^2=|0\rangle\langle ^{0|}+i|1\rangle\rangle\langle 1|$ $|CCZ\rangle=\Sigma_{a,b,c=0,1}(-1)^{abc}|a,b,c\rangle$ and $|\pm\rangle=|0\rangle\pm|1\rangle$.

Returning to FIG. 1, quantum computer 10 includes a controller 18. The controller may include at least one processor 20 and associated computer memory 22. A processor 20 of controller 18 may be coupled operatively to peripheral componentry, such as network componentry, to enable the quantum computer to be operated remotely. A processor 20 of controller 18 may take the form of a central processing unit (CPU), a graphics processing unit (GPU), or the like. As such, the controller may comprise classical electronic componentry. The terms 'classical' and 'non-quantum' are applied herein to any component that can be modeled accurately as an ensemble of particles without considering the quantum state of any individual particle. Classical electronic components include integrated transistors, resistors, and capacitors, for example. Computer memory 22 may be configured to hold program instructions 24 that cause processor 20 to execute any function or process of the controller. In examples in which qubit register 12 is a low temperature or cryogenic device, controller 18 may include control componentry operable at low or cryogenic temperatures—e.g., a field-programmable gate array (FPGA) operated at 77K. In such examples, the low-temperature control componentry may be coupled operatively to interface componentry operable at normal temperatures.

Controller 18 of quantum computer 10 is configured to receive a plurality of inputs 26 and to provide a plurality of outputs 28. The inputs and outputs may each comprise digital and/or analog lines. At least some of the inputs and outputs may be data lines through which data is provided to and/or extracted from the quantum computer. Other inputs may comprise control lines via which the operation of the quantum computer may be adjusted or otherwise controlled.

Controller 18 is operatively coupled to qubit register 12 via quantum interface 30. The quantum interface is configured to exchange data bidirectionally with the controller. The quantum interface is further configured to exchange signal corresponding to the data bidirectionally with the qubit register. Depending on the architecture of quantum computer 10, such signal may include electrical, magnetic, and/or optical signal. Via signal conveyed through the quantum interface, the controller may interrogate and otherwise influence the quantum state held in the qubit register, as defined by the collective quantum state of the array of qubits 14. To this end, the quantum interface includes at least one modulator 32 and at least one demodulator 34, each coupled operatively to one or more qubits of the qubit register. Each modulator is configured to output a signal to the qubit register based on modulation data received from the controller. Each demodulator is configured to sense a signal from the qubit register and to output data to the controller based on the signal. The data received from the demodulator may, in some examples, be an estimate of an observable to the measurement of the quantum state held in the qubit register.

In some examples, suitably configured signal from modulator 32 may interact physically with one or more qubits 14 of qubit register 12 to trigger measurement of the quantum state held in one or more qubits. Demodulator 34 may then sense a resulting signal released by the one or more qubits pursuant to the measurement, and may furnish the data corresponding to the resulting signal to controller 18. Stated another way, the demodulator may be configured to output, based on the signal received, an estimate of one or more observables reflecting the quantum state of one or more qubits of the qubit register, and to furnish the estimate to the controller. In one non-limiting example, the modulator may provide, based on data from the controller, an appropriate voltage pulse or pulse train to an electrode of one or more qubits, to initiate a measurement. The demodulator may sense photon emission from the one or more qubits and may assert a corresponding digital voltage level on a quantum-interface line into the controller. Generally speaking, any measurement of a quantum-mechanical state is defined by the operator O corresponding to the observable to be measured; the result R of the measurement is guaranteed to be one of the allowed eigenvalues of O. In quantum computer 10, R is statistically related to the qubit-register state prior to the measurement, but is not uniquely determined by the qubit-register state.

Pursuant to appropriate input from controller 18, quantum interface 30 may be configured to implement one or more quantum-logic gates to operate on the quantum state held in qubit register 12. Whereas the function of each type of logic gate of a classical computer system is described according to a corresponding truth table, the function of each type of quantum gate is described by a corresponding operator matrix. The operator matrix operates on (i.e., multiplies) the complex vector representing the qubit register state and effects a specified rotation of that vector in Hilbert space.

The foregoing list of quantum gates is non-exhaustive, but is provided for ease of illustration. Other gates may include Pauli-X, -Y, -Z gates, Toffoli, Ising, Deutsch gates, or Hadamard gates as non-limiting examples. Some example protocols disclosed herein adhere to a scenario where there are geometric constraints and limits on the elementary gates. In the examples described below, elementary operations are horizontal ZZ and vertical XX measurements across nearest neighbor qubits on a square grid of qubits, along with single-qubit X and Z measurements. In some examples, no Hadamard gate is used.

As discussed above, a universal quantum computer based on Clifford gates must be augmented with additional, non-Clifford operations. The states enabling these operations are known as magic states, two such examples being the one-qubit T state and the three-qubit CCZ states. For sufficient error reduction, the quality of the magic states should be similar to the quality of the Clifford gates. As mentioned above, magic state distillation takes many low-quality or noisy magic states and distills them into a fewer number of higher-quality magic states. The collection of qubits and quantum gates in a quantum computer responsible for performing the distillation may be referred to as a magic state factory.

In the disclosed examples, example protocols for magic state distillation involve two levels of error correcting code, namely, the above-mentioned inner and outer codes. Distillation protocols may use a full or partial error correcting code as the outermost code. The outer code may be used to correct both X and Z errors, and may further help to avoid or correct correlated errors. The example methods further take advantage of the error correcting properties of the inner code. In some examples, error correction methods may function despite constraints such as limited connectivity.

A logical qubit comprising a quantum state may be encoded across a plurality of physical qubits, which may be referred to as a surface code patch, or "patch". Qubits encoded in larger patches may be better protected (better error correction) than qubits encoded in smaller patches, and a higher-quality qubit may require a larger surface code patch. The example methods disclosed herein produce a distilled magic state on a standalone output qubit, which may be a surface code patch. In some examples, the method comprises embedding of a qubit into a better-quality qubit, which amounts to a growth of patch size. In some examples, this embedding occurs for one qubit in the entire distillation protocol.

Figure 3:
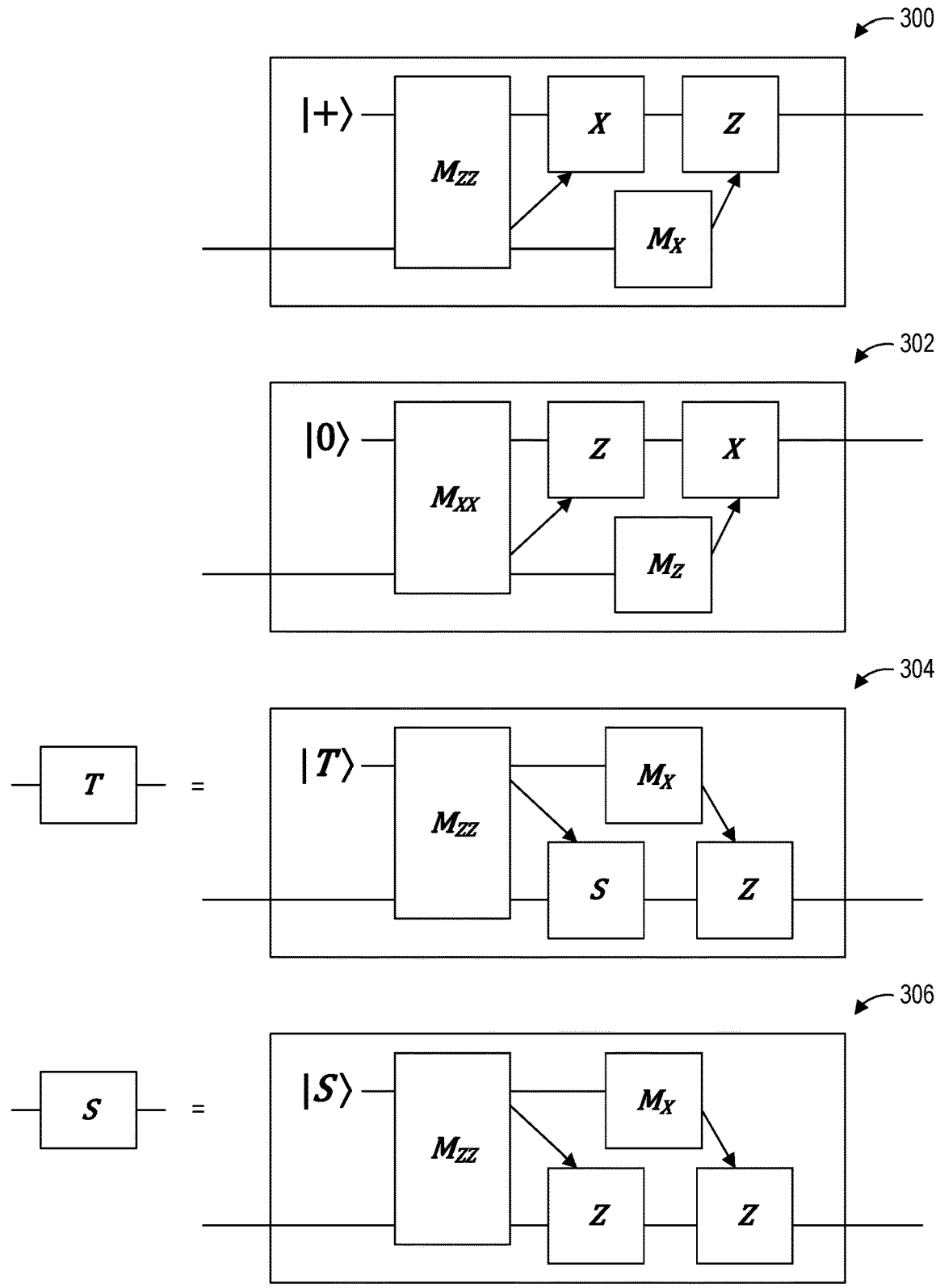
FIG. 3 schematically shows example measurement sequences for teleporting an arbitrary state to a qubit and for injecting a T or S state by measurements.

As discussed above, in some examples there may be a strict limitation on the elementary gates. With the exception of the output qubit discussed above, every operation of each of the example protocols disclosed herein comprises a measurement of a multiqubit Pauli operator $X^{\otimes m}$ for some integer m, a single qubit measurement in the X and Z basis, and a single qubit unitary by X Z, and T. Quantum states may be teleported from one qubit to another via measurements. FIG. 3 depicts two such schemes 300 and 302 for arbitrary state teleportation using either a ZZ measurement or XX measurement, respectively, along with single-qubit measurements. A T state may be injected, i.e., teleported into the block code, via ZZ and X measurements, as depicted in scheme 304 in FIG. 3. Likewise, an S state may be injected via scheme 306.

Figure 4:
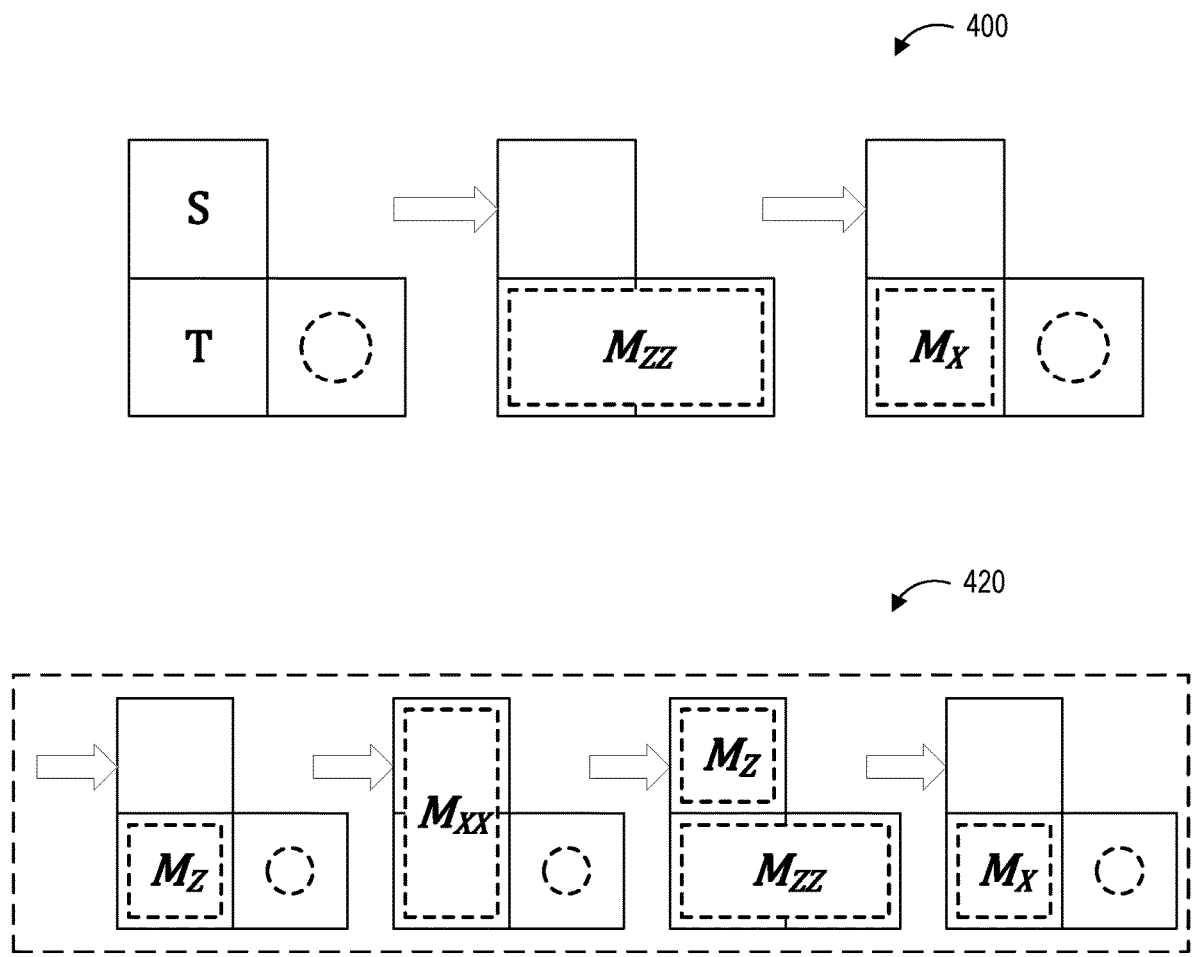
FIG. 4 schematically shows example schemes for teleporting a magic state into block code given geometric constraints.

However, in some examples, when geometric constraints only allow for horizontal ZZ and vertical XX measurements on a square grid of qubits, another injection scheme may be used for T states. As shown in FIG. 4, scheme 400 may be used to inject T states under these constraints. However, an S correction may be required depending on a ZZ measurement outcome of −1, in which case scheme 400 may be followed by scheme 420.

Multiqubit measurements may be performed by cat states. In some examples, a procedure may be followed that uses 2n−1 qubits and single-qubit X and nearest neighbor ZZ measurements to produce an n-qubit cat state. Using a cat state, $|0^{\otimes m}\rangle+|1^{\otimes m}\rangle$ for example, $X^{\otimes m}$ may be measured by taking the parity of vertical XX measurements between a cat state qubit and a data qubit. These measurements may be followed by single-qubit Z measurements on the cat state qubits and subsequent Pauli corrections on the data qubits to return the data qubits in the correct post-measurement state.

Figure 5:
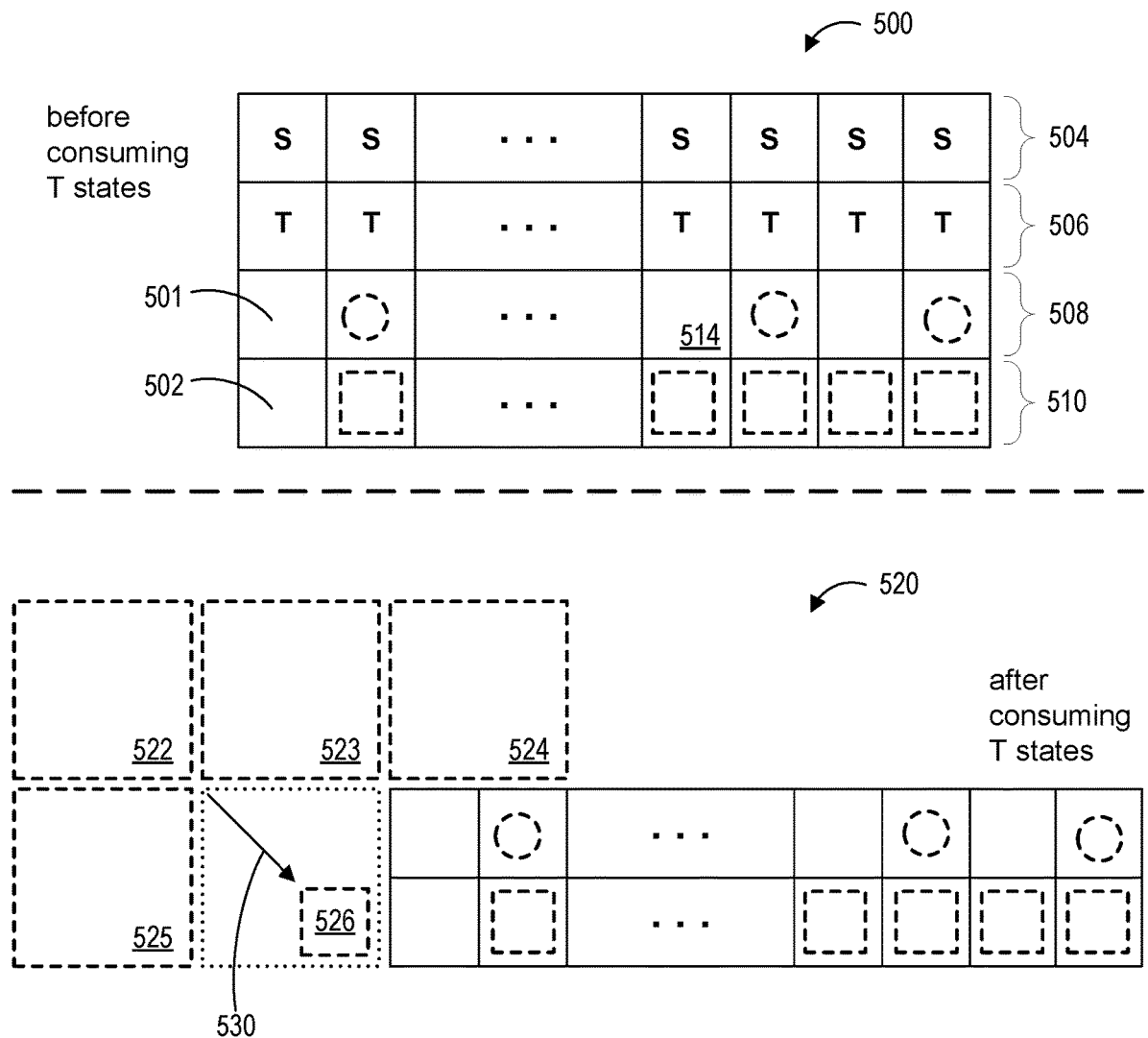
FIG. 5 schematically shows an example layout of an [[n,k,d]] block code.

An example layout of qubits for a protocol is depicted in FIG. 5, which shows an example [[n,k,d,]] block code comprising an array of qubits. A qubit represented in a block in FIG. 5 may be a surface code patch, rather than a single physical qubit. In layout 500, the first row 504 and second row 506 are occupied by S and T states, respectively. These S and T states are to be consumed, and layout 500 shows the qubits before consuming T states. Every other qubit of the third row 508 is occupied by a data qubit of the block code. The fourth row 510 contains qubits which are used for cat state preparation. During the distillation protocol, noisy T states may be brought to the side of the array of qubits at qubit 501 and qubit 502. In this example, the [[n,k,d]] stabilizer code operates in the third row 508. The blank qubits on the third row, e.g., qubit 514, may be used to inject T states by horizontal ZZ measurements.

In some examples, there will be k+2 output qubits of better quality, two of which are ancilla. As such, layout 520 in FIG. 5 may represent the case when k=3 and 5 larger output patches 522, 523, 524, 525, and 526 are produced. Patches may change dynamically, such as patch 524 shrinking in size. The output qubits may interact with the encoded qubits of the block code after the S and T states are consumed. As discussed above, the output qubits may be better quality and occupy a larger surface code patch than the other qubits. In some examples, for quadratic error reductions, the size of the surface code patches for better quality qubits may be approximately twice as large as the other qubits. In other examples, the precise size may be determined based on the desired quality of the output qubits. In some examples, the space occupied by the S and T states, i.e., rows 504 and 506, can be used for the output qubits. For example, patch 524 may occupy a space previously occupied by S and T states. Further, the leftmost column of the code in layout 500 before consuming T states, including qubits 501 and 502, may be occupied by output qubits 523 and 526 after consuming T states in layout 520.

The error model will now be discussed. Every measurement outcome is flipped with probability p∈[0,1). Every qubit suffers from independent noise after any operation including the identity. The single qubit error is modeled by a quantum channel $$\varepsilon(\rho)=(1-p_e)\rho+pD(\rho) \quad (1)$$

where D is another quantum channel. Note that the same p is used for both the measurement outcome error and the single qubit noise. Any T states and any T or $T^\dagger$ gates are immediately followed by $$\varepsilon(\rho)=(1-p_t)\rho+p_tD(\rho) \quad (2)$$

but not by ε. Note that the same D is used in Eqs. (1) and (2) for simplicity.

Output qubits may be treated as if they were noise free. Using a surface code family, it may suffice to choose a code distance that matches the quality of the distilled magic states. One may wonder how the independent noise assumption can be fulfilled after measurements of $X^{\otimes m}$, a multi-qubit operator. A naive preparation of the cat states introduces correlated errors and using such a cat state for our measurement may invalidate the independent noise assumption. Hence, a more careful protocol may be used to prepare cat states that differ from ideal ones by independent noise on constituent qubits. The protocol above achieves this goal.

As discussed above, in some example a magic state encoded in a block code is teleported to an output qubit in the disclosed examples. This may be performed, for example, by preparing a state of $Z_{out}=+1$ and measuring $X_{out}X$ and $Z$ where $X,Z$ are logical operators of the block code. Using surface code patches, the output qubit may be initialized and $Z$ measured on the code. However, the measurement of $X_{out}X$ is unusual since the data qubits of the block code have smaller size. Here, a cat state may be prepared and used for the measurement. An example protocol for state teleportation to a large surface code patch via cat state preparation is as follows. First, let a and b denote two large surface code patches, e.g., patches 525 and 526, respectively. Patch b may change size dynamically as indicated by arrow 530 in FIG. 5. Then proceed as follows to prepare the cat state:

1) Prepare $|00\rangle_{ab}$ and measuring $X_aX_b$ with a Pauli correction to have $|00\rangle_{ab}+|11\rangle_{ab}$,
2) Shrink patch b to match the size of the patches in the fourth row of the 4×(2n−1) rectangle, and
3) Measure ZZ between nearest neighbors in the fourth row and discarding every other qubit.

Step 3 above may be achieved as described above. Since the leftmost pair measurement is performed on large patches, the output qubits may be protected. Once the cat state is protected the $X_{out}X$ measurement may be completed with the following procedure:

$$\left(\sum_{\vec{v}:even\ weight} Z_{\vec{v}}|+^{\otimes m}\rangle\right) \otimes \left(\sum_{\vec{f}} a_{\vec{f}} Z_{\vec{f}}|+^{\otimes m}\rangle\right) \quad (3)$$

$$\xrightarrow{M_{XX}^{\otimes m}} \sum_{\vec{v}:even} a_{\vec{v}+\vec{x}} Z_{\vec{v}}|+^{\otimes m}\rangle Z_{\vec{v}+\vec{x}}|+^{\otimes m}\rangle$$

$$\xrightarrow{M_{Z,cat}^{\otimes m}} \sum_{\vec{v}:even} a_{\vec{v}+\vec{x}}(-1)^{\vec{v}\cdot\vec{z}} Z_{\vec{v}+\vec{x}}|+^{\otimes m}\rangle$$

$$\xrightarrow{M_{\vec{z},data}} \sum_{\vec{v}:even} a_{\vec{v}+\vec{x}}(-1)^{\vec{v}\cdot\vec{z}} Z_{\vec{v}+\vec{x}}|+^{\otimes m}\rangle$$

Next, example protocols will be discussed for distilling magic states from noisy T states.

In various examples, a magic state distillation protocol distills magic states encoded in a [[n,k,d]] block code comprising an outer code. The [[n,k,d]] block code may be arranged in a layout similar to the layout depicted in FIG. 5, or any other suitable layout. First, k encoded magic states are prepared using n data qubits. In the specific example of FIG. 5, the locations of the n data qubits are represented by dashed circles 508 and may comprise surface code patches. Each of the n data qubits may be a logical qubit of some further inner code. The method further comprises applying an inner code to measure Clifford stabilizers on the n data qubits. The method further comprises initializing k output qubits and then initiating a teleportation of k distilled magic states to the k output qubits. The k distilled magic states are derived from the k encoded noisy magic states.

The method further comprises measuring X-stabilizers on the n data qubits and postselecting on all +1 outcomes. Here, the X-stabilizers may be specific stabilizers configured for the [[n,k,d]] block code. Postselecting on +1 outcomes implies that if the measurement produces a +1 outcome, the output qubits may be deemed sufficient quality and may be used in a quantum computation. If a different outcome is produced from the measurement, then the errors are too large and the result may be discarded, i.e., the output qubits are not of sufficient quality to be used in a quantum computation. In some examples, the method may be terminated and restarted upon an unfavorable postselection outcome. The method further comprises measuring each data qubit destructively utilizing Z-stabilizers and applying one or more postselection conditions to the n data qubits to complete the teleportation of the k distilled magic states to the k output qubits. If all postselections have succeeded, the output qubits are used in a quantum computation.

In some examples, the distillation method produces k+2 output qubits comprising k magic states and 2 ancillas. The output qubits may comprise surface code patches as those depicted by patches 522–526 in FIG. 5.

In one more specific example protocol, the magic state distillation method comprises an outer code, which is a $2^{nd}$ order normal weakly selfdual CSS code by [[6,2,2]]. Here, n=6, k=2, and d=2. The steps in the protocol are as follows:

1) initializing six data qubits in $|\bar{0}\rangle^{\otimes 6}$ and bringing $|\bar{T}\rangle_{t1}$ and $|\bar{T}\rangle_{t2}$ on a side of a qubit array,
2) measuring XXXXII and IIXXXX on the six data qubits and applying Z measurements on the six data qubits to obtain logical qubits comprising a logical state with ZIZIZI≈IZIZIZ≈+1,
3) teleporting states in qubits $t_1$, $t_2$ into the logical qubits via measuring $X_{t1}X_1$, $X_{t2}X_2$ and then measuring $Z_{t1}$, $Z_{t2}$ followed by Pauli Z corrections on the logical qubits, the Pauli Z corrections based upon the $X_{t1}X_1$, $X_{t2}X_2$ and $Z_{t1}$, $Z_{t2}$ measurements, $X_1$ and $X_1$ being logical operators $X_1$=XIXIXI and $X_2$=IXIXIX;
4) applying $T^{\otimes 6}$ on the data qubits,
5) measuring $X^{\otimes 6}$ twice on the data qubits and postselecting on all +1 outcomes,
6) applying $(T^\dagger)^{\otimes 6}$ on the data qubits;
7) initializing two output qubits o1, o2 in $|0\rangle^{\otimes 2}$,
8) measuring $X_{o1}X_1$ twice with outcomes $x_1$, $x_1'$, measuring $X_{o2}X_2$ twice with outcomes $x_2$, $x_2'$, postselecting on consistent outcomes $x_1=x_1'$ and $x_2=x_2'$, and applying $Z_{o1}$ if $x_1=-1$ and $Z_{o2}$ if $x_2=-1$;
9) measuring XXXXII and IIXXXX on the six data qubits and postselecting on all +1 outcomes;
10) measuring individual data qubits destructively in the Z basis to obtain outcomes $z_1, \ldots z_6$ and postselecting on both conditions $z_1z_2z_3z_4=+1$ and $z_3z_4z_5z_6=+1$, and applying $X_{o1}$ if $z_1z_3z_5=-1$ and $X_{o2}$ if $z_2z_4z_6=-1$.

Here, preparation of two encoded noisy T states in 6 data qubits is accomplished in steps 1, 2, and 3. In steps 4, 5, and 6, the Clifford stabilizers are measured on the 6 data qubits. The two output qubits are initialized in step 7. Initiation of the teleportation of the two encoded magic states to the two output qubits occurs at step 8. Step 9 involves measuring the X-stabilizers on the six data qubits and postselecting based on the outcomes. Step 10 measures each data qubit destructively utilizing Z-stabilizers and applies one or more postselection conditions to the n data qubits to complete the teleportation of the k distilled magic states to the k output qubits. The two output qubits comprise two distilled T states.

The measurement depth is counted as follows. There are $m_1=3$ rounds of single-qubit measurements on the data qubits in Steps 1, 3, 10. There are $m_2=2+2+2+2=8$ rounds of multiqubit X-measurements on the data qubits in Steps 2, 3, 5, 9. There are 2 rounds of T-gates on data qubits in Steps 4,6, which would involve input T and S states. An injection of T gate that requires an S correction involves 6 one- and two-qubit measurements (e.g. see FIG. 4). T states can be transported right next to the data qubits and S state right above T state while other steps are being executed. So, there are $m_t=12$ rounds of single- or two-qubit measurements. There are $m_{out}=4$ rounds of joint measurements in Step 3 between the output qubits and data qubits. The initialization of the output qubits may be neglected since that can be done in parallel with previous data qubits measurements. Overall, there are $m_1+m_t=15$ rounds of one- and two-qubit measurements, $m_2=8$ rounds of multi-qubit X-measurements on the data qubits, and $m_{out}=4$ rounds X-measurements that involves the output qubits.

To be more specific on the measurement count using surface code patches, treat one syndrome measurement of the surface code patch as the unit time. Assume that d rounds of syndrome measurements are needed for surface code patches of the data qubits and d' rounds of syndrome measurements for the output qubits for one logical operation; d or d' is the code distance of a patch. To prepare a cat state that is "2-fault-tolerant", 8 rounds of logical operations are needed across nearest patches. This time is long enough that all explicit one- and two-qubit measurements in Steps 1, 4, 6 can be ignored, as they can run in parallel with the cat state preparation for the next step. Step 9 is also negligible. The last round of the cat state preparation of [14] consists of single-qubit X measurements on qubits that do not partake in the final cat state, which can run in parallel with XX measurements between the cat state qubits and data qubits. Including single-qubit Z measurements in conclude that one multiqubit X-measurement takes time 9d, or 7d+2d' if it involves the output qubits. So, the total time is $m_2 \cdot 9d + m_{out}(7d+2d')$. The number of physical qubits used is $4 \cdot 12 \cdot d^2 + 4d'^2$, neglecting ancillas for syndrome measurements of the surface code.

In another example protocol, the magic state distillation method comprises an outer code, which is a $3^{rd}$ order normal weakly selfdual CSS code by [[7,1,3]]. Here, n=7, k=1, and d=3. The steps in the protocol are as follows:
1) initializing seven data qubits in $|0\rangle^{\otimes 7}$ and bringing $|\tilde{T}\rangle_t$ on a side of a qubit array,
2) measuring three X-stabilizers XIXIXIX, IXXIIXX and IIIXXXX on the seven data qubits and applying Z measurements on the six data qubits to obtain logical qubits comprising a logical state with ZZZZZZZ≈+1, and
3) teleporting into the code via measuring $X_t X$ and then measuring $Z_t$, measurement X being logical operator $X=X^{\otimes 7}$;
4) measuring the three X-stabilizers and postselecting on all +1 outcomes;
5) applying $T^{\otimes 7}$ on the data qubits,
6) measuring $X^{\otimes 7}$ twice on the data qubits and postselecting on all +1 outcomes, and
7) applying $(T^\dagger)^{\otimes 7}$ on the data qubits;
8) initializing an output qubit in the state $|0\rangle_o$;
9) measuring three equivalent X-logical operators of the code multiplied by the X-operator on the output qubit, $X_o(IXIXIXI)$, $X_o(XIIXXII)$, $X_o(XXXIIII)$, with outcomes $x_1,x_2,x_3=\pm 1$, postselecting on consistent results $x=x_1=x_2=x_3$, and applying $Z_o$ if $x=-1$;
10) measuring the three X-stabilizers and postselecting on all +1 outcomes; and
11) destructively measuring all data qubits in the Z basis to obtain outcomes $z_1, \ldots z_7$ and postselecting on three conditions $z_1z_3z_5z_7=+1$, $z_2z_3z_6z_7=+1$, and $z_4z_5z_6z_7=+1$, applying $X_o$ if $z_1z_3z_5=-1$.

Here, preparation of an encoded noisy T state in 7 data qubits is accomplished in steps 1, 2, and 3. Step 4 checks X-stabilizers. In steps 5, 6, and 7, the Clifford stabilizer $TXT^\dagger$ are measured of the encoded T state. The Clifford stabilizer is induced by $(T^\dagger XT)^{\otimes 7}$. Step 4 has no analog in the previous protocol disclosed above. The error check in step 4 may avoid a two-error process, where one Z error in steps 1, 2, 3 and another in step 7, may cancel each other out to let an incorrect T state pass through the Clifford stabilizer check. Steps 8, 9, 10, and 11 combine teleportation of the encoded T state with Pauli stabilizer checks. The two output qubits are initialized in step 8. Initiation of the teleportation of the two encoded magic states to the two output qubits occurs at step 9. Step 9 uses three representatives of logical operators to detect second order processes that may result in teleportation errors. Step 10 involves measuring the X-stabilizers on the six data qubits and postselecting based on the outcomes. In step 11, the data qubits are measured destructively utilizing Z-stabilizers to complete the teleportation. The output qubit comprises a distilled T state.

The measurement depth is counted as follows. As discussed previously, only the number of multiqubit measurements are counted. Here, "3-fault-tolerant" cat states may be needed and may necessitate 10 rounds of one- and two-qubit measurements. For those that do not involve the output qubits, there are 3+3+2+3=11 measurements in Steps 2, 4, 6, 10. For those that involve the output qubits, there are 1+3=4 measurements in steps 3,9. Using surface code patches of distance d (data) and d' (output), there are $11 \cdot 11d + 4 \cdot (9d+2d')$ rounds of syndrome measurements for the surface code patches. The number of qubits used is $56d^2+3d'^2$, neglecting ancillas of the surface code.

In another example protocol, the magic state distillation method comprises an outer code, which is a $2^{nd}$ order triorthogonal CCZ code by [[8,3,2]]. Here, n=8, k=3, and d=2. This protocol is based on a generalization (Campbell, supra) of triorthogonal codes (See, e.g., Brayvi, supra) which induces a logical CCZ gate upon transversal T gate. The steps in the protocol are as follows:
1) initializing eight data qubits in $|0\rangle^{\otimes 8}$,
2) measuring the X-stabilizer XXXXXXXX on the eight data qubits, measuring three X-logical operators $X_1$=IXIXIXIX, $X_2$=IIXXIIXX, $X_3$=IIIIXXXX, and
   upon −1 outcomes for any of the X-stabilizer and X-logical operators, applying Pauli corrections by ZIIIIIII and Z-logical operators such that the resulting state is the logical state $|+++\rangle$,
3) measuring IXXIXIIX and postselecting on the +1 outcome;
4) applying $\tilde{T}^\dagger \otimes \tilde{T} \otimes \tilde{T} \otimes \tilde{T}^\dagger \otimes \tilde{T} \otimes \tilde{T}^\dagger \otimes \tilde{T}^\dagger \otimes \tilde{T}$ on the data qubits,
5) initializing three output qubit in the state $|000\rangle_{o1,o2,o3}$,
6) measuring $X_{o1}X_1$ twice with outcomes $x_1$, $x_1'$,
   measuring $X_{o2}X_2$ twice with outcomes $x_2$, $x_2'$,
   measuring $X_{o3}X_3$ twice with outcomes $x_3$, $x_3'$,
   postselecting on consistent outcomes $x_1=x_1'$, $x_2=x_2'$, $x_3=x_3'$,
   applying $Z_{o1}$ if $x_1=-1$,
   applying $Z_{o2}$ if $x_2=-1$, and
   applying $Z_{o3}$ if $x_3=-1$;

7) measuring the X-stabilizer $X^{\otimes 8}$ on the data qubits and postselecting on a +1 outcome;

8) destructively measuring all data qubits in the Z basis to obtain outcomes $z_1, \ldots, z_8$ and postselecting on all four conditions $z_1z_2z_3z_4=+1$, $z_2z_4z_6z_8=+1$, $z_3z_4z_7z_8=+1$, and $z_5z_6z_7z_8=+1$.

Here, preparation of three encoded noisy magic states in 8 data qubits is accomplished in steps 1, 2, and 3. In step 4, Clifford stabilizers are measured on the 8 data qubits. In step 5, the three output qubits are initialized. In step 6, the teleportation is initiated for teleportation of the three encoded magic states to the three output qubits. The X-stabilizers are measured on the 8 data qubits at step 7, in addition to postselection based on the outcomes. In step 8, the data qubits are measured destructively utilizing Z-stabilizers and postselection conditions are applied to the 8 data qubits to complete the teleportation. The three output qubits comprise a distilled |CCZ⟩ state. At step 4, the product of and is chosen to ensure that the underlying triorthogonal code satisfies the "level-3" orthogonality (see, e.g., J. Haah, Phys. Rev. A 97, 04237, 2018, arXiv:1709.08658, hereinafter, Haah), which removes the need of Clifford corrections of Campbell, supra.

The measurement depth is counted similarly as the previous protocols, only counting multiqubit measurements. Here, "2-fault-tolerant" cat states are needed. There are 4+1+1=6 measurements in steps 2, 3, 6 that do not involve output qubits. There are 6 measurements in step 5 that involve output qubits. Using surface patches of distance d (data) and d' (output), the duration of the protocol is 6·9d+ 6·(7d+2d'). The number of qubits used is $4 \cdot 16d^2+5d'^2$, neglecting ancillas of the surface code.

The error model will now be discussed. The complete protocols were simulate using density matrices which is easy as they involve at most 11 qubits. A numerical examination of $p_{out}$ was performed as a function of p, $p_t \in (10^{-6}, 10^{-4})$ for a given D, and fitted to a polynomial formula $p_{out}=ap_t^2+ bp_tp+cp^2$ or $p_{out}=ap_t^3+bp_t^2 p+cp_tp^2+dp^3$ where a, b, c, d are fitting parameters. Table 1 shows these coefficients rounded to integers.

TABLE I

Error of the output states measured in the trace distance
$p_{out} = \frac{1}{2}\|\rho_{ideal} - \rho_{out}\|_1$ as
a function of two parameters p, $p_t$ that represent the strength
of noise for Clifford operations and T gates/states, respectively.

| T-to-T using [[6, 2*, 2]] $p_{accept} \geq (1 - p)^{91}(1 - p_t)^{14}$ | | | |
|---|---|---|---|
| D(ρ) | $p_t^2$ | $p_tp$ | $p^2$ |
| ⅓(XρX + YρY + ZρZ) | 2 | 32 | 84 |
| XρX | 6 | 62 | 188 |
| ZρZ | 7 | 89 | 97 |
| T-to-T using [[7, 1, 3]] $p_{accept} \geq (1 - p)^{141}(1 - p_t)^{15}$ | | | |
| D(ρ) | $p_t^3$ | $p_t^2p$ | $p_tp^2$ | $p^3$ |
| ⅓(XρX + YρY + ZρZ) | 3 | 34 | 276 | 855 |
| XρX | 16 | 335 | 2606 | 6977 |
| ZρZ | 35 | 183 | 429 | 355 |

TABLE I-continued

Error of the output states measured in the trace distance
$p_{out} = \frac{1}{2}\|\rho_{ideal} - \rho_{out}\|_1$ as
a function of two parameters p, $p_t$ that represent the strength
of noise for Clifford operations and T gates/states, respectively.

| T-to-CCZ using [[8, 3, 2]] by step 7a $p_{accept} \geq (1 - p)^{124}(1 - p_t)^8$ | | | |
|---|---|---|---|
| D(ρ) | $p_t^2$ | $p_tp$ | $p^2$ |
| ⅓(XρX + YρY + ZρZ) | 8 | 171 | 958 |
| XρX | 18 | 397 | 2340 |
| ZρZ | 28 | 462 | 1414 |

*reduced density matrices on each output qubit are not taken when computing $p_{out}$.

The example CCZ state distillation protocol may be designed to achieve quadratic error suppression, and thus all the cat states there may be configured to be 2-fault-tolerant only (see, e.g. ref 14). Assuming that indeed the cat states are only 2-fault-tolerant, it is not too meaningful to analyze the protocol where Step 7 is supposed to achieve quartic error suppression for X errors. Hence, to have a conservative estimate of $p_{out}$ in the CCZ distillation protocol, the following alternative to Step 7 was used in the simulation:

7a) Destructively measure all data qubits in Z basis with outcomes $z_1, \ldots, z_8$. Postselect on the condition $z_1z_2z_3z_4z_5z_6z_7z_8=+1$. Apply $X_{o1}$ if $z_7z_8=-1$, $X_{o2}$ if $z_6z_8=-1$, and $X_{o3}$ if $z_4z_8=-1$.

In practice, step 7 may be preferred to alternative step 7a as step 7 may catch more errors with no complication of quantum operations in comparison to step 7a. The overall success probability decreases when we do Step 7 rather than 7a but only by a negligible amount. If one is curious what $p_{out}$ would be using Step 7, not 7a, under the very noise model of ours, the following formulas are provided:

$p_{out} \approx 3p_t^2+58p_tp+200p^2$ if $D(\rho)=\frac{1}{3}(X\rho X+Y\rho Y+Z\rho Z)$,
$p_{out} \approx 28p_t^2+462p_tp+1397p^2$ if $D(\rho)=Z\rho Z$, and
$p_{out} \approx 12p_t^4+0.035p_tp+9p^2+2300p^3$ if $D(\rho)=X\rho X$, To test the accuracy of the leading order formulas for $p_{out}$ that are presented in Table I, i.e., the contributions from higher order terms, $p_{out}$ is computed as a function of λ=0.0, 0.2, 0.4, 0.6, 0.8, 1.0 by setting $p=10^{-2}\lambda$ and $p_t=10^{-2}(1-\lambda)$. It is observed that the leading order formulas for $p_{out}$ are correct to 29% relative accuracy for these values of p, $p_t$ in all cases. Note that conventional leading order formulas are reproduced in this analysis by setting p=0 and $D(\rho)=Z\rho Z$:

(i) $p_{out} \approx 7p_t^2$ for [[6; 2; 2]] (C. Jones, Phys. Rev. A 87, 022328, 2013, arXiv: 1212.5069, hereinafter, Jones) which is equivalent (Haah, supra) to the smallest example of triorthogonal codes (Brayvi, supra), (ii) $p_{out} \approx 35p_t^3E$ for [[7; 1; 3]] (Knill) which is equivalent (Haah, supra) to the smallest example of quantum Reed-Muller codes (S. Brayvi and A. Kitaev, Phys. Rev. A 71, 022316, 2005, arXiv:quant-ph/0403025; and J. Haah and M. Hastings, Quantum 2, 71, 2018, arXiv: 1709.02832, hereinafter Haah 2018B), and (iii) $p_{out} \approx 28p_t^2$ for [[8; 3; 2]] (See, e.g., Campbell, supra; B. Eastin, Phys. Rev. A, 87, 032321, 2013, arXiv: 1212.4872; Jones, supra; and Haah 2018B, supra).

The acceptance probability $p_{accept}$ was also numerically computed, and the formula was satisfied by all the three error channels considered. The exponents of (1-p) and (1-$p_t$) are approximately the number of possible error locations under our error model. Note that this acceptance probability assumes that the cat state preparation is successful.

In some examples, the surface code in a patch is configured to operate in error correcting mode, where errors are detected and corrected. In these examples, the outermost code may be configured to operate in error detecting mode, where, if no errors are detected, the distilled magic state is kept for use in a quantum computation and if one or more errors are detected, the distilled magic state is discarded. In other examples, a partial error correcting mode may be used, in which case one might correct errors if a small number of errors would give the observed syndrome, and discard otherwise. More generally, some set of observed syndromes may be chosen for correction and others chosen for discard. As it pertains to surface code inside a magic state factory, if a state is discarded due to errors it may have no effect on the rest of the computation. However, if a state on an observed syndrome is discarded it may require discarding all computations up to that point due to entanglement with other states.

In other examples, the surface code in patches of the magic state factory may be configured to operate in error detecting mode. In such examples, a surface code of distance d may suppress errors up to d-th order by performing d rounds of syndrome measurements after each logical measurement. Logical errors may be suppressed if fewer than d physical errors occur in any round of logical measurements. The average number or errors is p times the number of error locations; there are $d^2-1$ syndromes, and so $d(d^2-1)$ syndrome measurements may be performed. Each syndrome measurement may be broken into some number of physical operations depending on the physical implementation and error rate of the physical qubits. It may require $pd(d^2-1) \ll 1$ to attain a large probability that the state will not be discarded on a given round, with the exact value depending on the implementation of syndrome measurements. As an example, a [[7,1,3]] code may require ~ 60 patches. Given a total number of rounds ~ 100, the method may need 6000 $d(d^2-1) \approx 1.6 10^5 \ll p^{-1}$ to obtain significant throughput. In some examples, if the physical error rate of a qubit is small, e.g., smaller than $10^{-6}$, a surface code patch may not be needed.

In other examples, the surface code may be configured to operate in partial error detecting mode. In these examples, the code may be configured to correct lower weight errors and discard states when higher weight errors are detected. However, if multiple errors are detected, i.e., a higher weight error is detected, the qubits may be discarded. In some examples, the code may be configured to correct up to one error in each patch in each round. In such examples, the method may implement $\sqrt{6000}d^3p \ll 1$. At high physical noise rates, it may be useful to implement even more relaxed forms of partial error correction in which one corrects larger numbers of errors.

Figure 6:
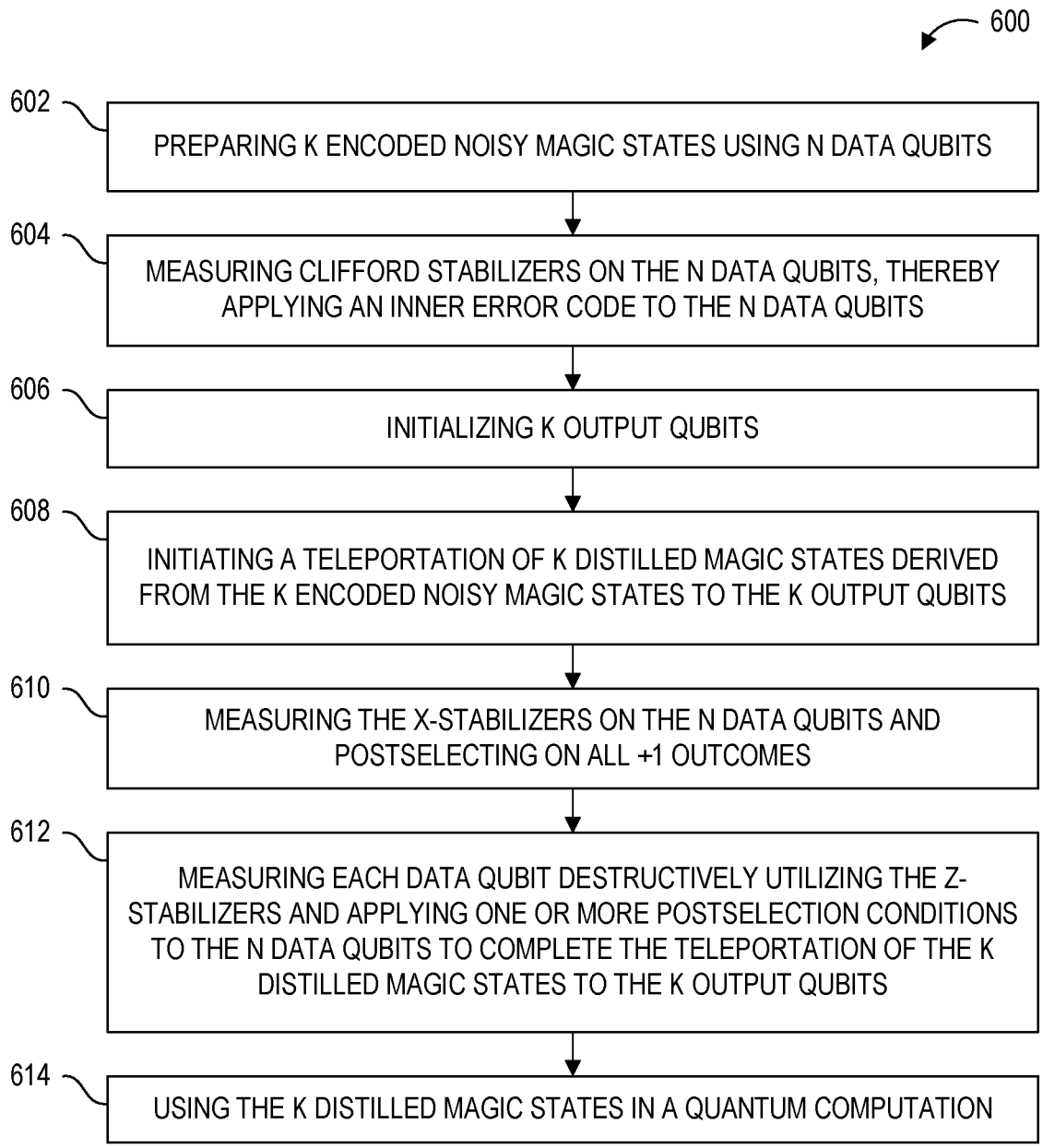
FIG. 6 shows a flow diagram of an example method for distilling magic states.

FIG. 6 shows a flow diagram depicting an example method 600 for distilling magic states encoded in a [[n,k,d]] block code comprising an outer code. Method 600 comprises, at 602, preparing K encoded noisy magic states using N data qubits. In some examples, the outer code may comprise a weakly selfduel block code by [[6,2,2]] or [[7,1,3]]. In other examples, the outer code may comprise a $2^{nd}$ order triorthogonal CCZ code by [[8,3,2]]. Method 600 further comprises, at 604, measuring Clifford stabilizers on the N data qubits, thereby applying an inner error correcting code to the N data qubits. Method 600 additionally comprises, at 606, initializing K output qubits, and at 608, initiating a teleportation of K distilled magic states derived from the K encoded noisy states to the K output qubits. Continuing, method 600 comprises, at 610, measuring the x-stabilizers on the N Data Qubits and postselecting on all +1 outcomes. Method 600 further comprises, at 612, measuring each data qubit destructively utilizing the Z-stabilizers, and applying one or more postselection conditions to the N data qubits to complete the teleportation of the K distilled magic states to the K output qubits. After completing the teleportation of the K distilled magic states to the N data qubits, method 600 comprises using the K distilled magic states in a quantum computation, at 614.

In some embodiments, the methods and processes described herein may be tied to a computing system of one or more computing devices. In particular, such methods and processes may be implemented as a computer-application program or service, an application-programming interface (API), a library, and/or other computer-program product.

Figure 7:
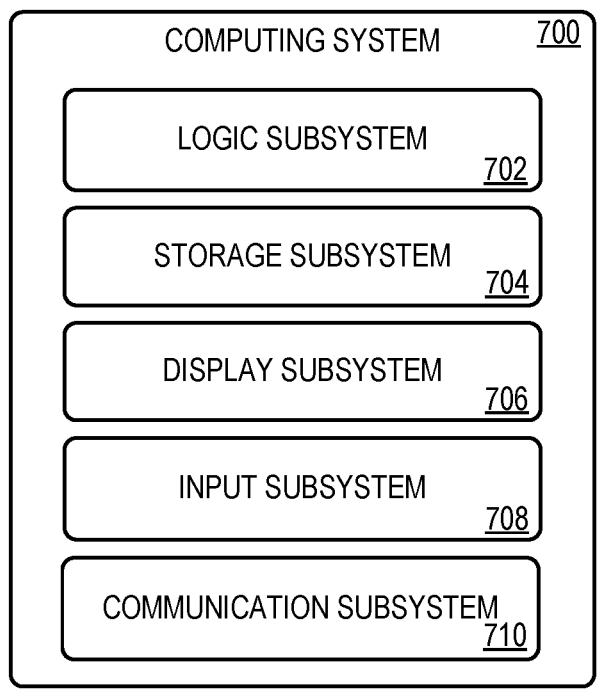
FIG. 7 shows a block diagram of an example computing system.

FIG. 7 schematically shows a non-limiting embodiment of a computing system 700 that can enact one or more of the methods and processes described above. Computing system 700 is shown in simplified form. Computing system 700 may take the form of one or more personal computers, server computers, tablet computers, home-entertainment computers, network computing devices, gaming devices, mobile computing devices, mobile communication devices (e.g., smart phone), and/or other computing devices.

Computing system 700 includes a logic subsystem 702 and a storage subsystem 704. Computing system 700 may optionally include a display subsystem 706, input subsystem 708, communication subsystem 710, and/or other components not shown in FIG. 7.

Logic subsystem 702 includes one or more physical devices configured to execute instructions. For example, the logic subsystem may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic subsystem 702 may include one or more processors configured to execute software instructions. Additionally or alternatively, the logic subsystem may include one or more hardware or firmware logic subsystems configured to execute hardware or firmware instructions. Processors of the logic subsystem may be single-core or multi-core, and the instructions executed thereon may be configured for sequential, parallel, and/or distributed processing. Individual components of the logic subsystem optionally may be distributed among two or more separate devices, which may be remotely located and/or configured for coordinated processing. Aspects of the logic subsystem may be virtualized and executed by remotely accessible, networked computing devices configured in a cloud-computing configuration.

Storage subsystem 704 includes one or more physical devices configured to hold instructions executable by the logic subsystem to implement the methods and processes described herein. When such methods and processes are implemented, the state of storage subsystem 704 may be transformed—e.g., to hold different data.

Storage subsystem 704 may include removable and/or built-in devices. Storage subsystem 704 may include optical memory (e.g., CD, DVD, HD-DVD, Blu-Ray Disc, etc.), semiconductor memory (e.g., RAM, EPROM, EEPROM, etc.), and/or magnetic memory (e.g., hard-disk drive, floppy-disk drive, tape drive, MRAM, etc.), among others. Storage subsystem 704 may include volatile, nonvolatile, dynamic, static, read/write, read-only, random-access, sequential-access, location-addressable, file-addressable, and/or content-addressable devices.

It will be appreciated that storage subsystem 704 includes one or more physical devices. However, aspects of the instructions described herein alternatively may be propagated by a communication medium (e.g., an electromagnetic signal, an optical signal, etc.) that is not held by a physical device for a finite duration.

Aspects of logic subsystem 702 and storage subsystem 704 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

It will be appreciated that a "service", as used herein, is an application program executable across multiple user sessions. A service may be available to one or more system components, programs, and/or other services. In some implementations, a service may run on one or more server-computing devices.

When included, display subsystem 706 may be used to present a visual representation of data held by storage subsystem 704. This visual representation may take the form of a graphical user interface (GUI). As the herein described methods and processes change the data held by the storage subsystem, and thus transform the state of the storage subsystem, the state of display subsystem 706 may likewise be transformed to visually represent changes in the underlying data. Display subsystem 706 may include one or more display devices utilizing virtually any type of technology. Such display devices may be combined with logic subsystem 702 and/or storage subsystem 704 in a shared enclosure, or such display devices may be peripheral display devices.

When included, input subsystem 708 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 710 may be configured to communicatively couple computing system 700 with one or more other computing devices. Communication subsystem 710 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 700 to send and/or receive messages to and/or from other devices via a network such as the Internet.

Another example provides, on a quantum computing device, a method for distilling magic states encoded in a [[n,k,d]] block code comprising an outer code, the method comprising preparing k encoded noisy magic states using n data qubits; measuring Clifford stabilizers on the n data qubits, thereby applying an inner error correcting code to the n data qubits; initializing k output qubits; initiating a teleportation of k distilled magic states derived from the k encoded noisy magic states to the k output qubits; measuring the X-stabilizers on the n data qubits and postselecting on all +1 outcomes; measuring each data qubit destructively utilizing the Z-stabilizers and applying one or more postselection conditions to the n data qubits to complete the teleportation of the k distilled magic states to the k output qubits; and using the k distilled magic states in a quantum computation. In some such examples, the outer code may be a $2^{nd}$ order normal weakly selfdual CSS code by [[6,2,2]], wherein n=6, k=2, and d=2. In such examples, preparing k encoded noisy magic states using n qubits comprises initializing six data qubits in $|0\rangle^{\otimes 6}$ and bringing $|\tilde{T}\rangle_{t1}$ and $|\tilde{T}\rangle_{t2}$ on a side of a qubit array, measuring XXXXII and IIXXXX on the six data qubits and applying Z measurements on the six data qubits to obtain logical qubits comprising a logical state with ZIZIZI≈IZIZIZ≈+1, and teleporting states in qubits t1, t2 into the logical qubits via measuring $X_{t1}X_1$, $X_{t2}X_2$ and then measuring $Z_{t1}$, $Z_{t2}$ followed by Pauli Z corrections on the logical qubits, the Pauli Z corrections based upon the $X_{t1}X_1$, $X_{t2}X_2$ and $Z_{t1}$, $Z_{t2}$ measurements, $X_1$ and $X_1$ being logical operators $X_1$=XIXIXI and $X_2$=IXIXIX; measuring Clifford stabilizers on the n data qubits comprises applying $T^{\otimes 6}$ on the data qubits, measuring $X^{\otimes 6}$ twice on the data qubits and postselecting on all +1 outcomes, and applying $(T^\dagger)^{\otimes 6}$ on the data qubits; initializing k output qubits comprises initializing two output qubits o1, o2 in $|0\rangle^{\otimes 2}$; initiating teleportation of the k encoded magic states to the k output qubits comprises measuring $X_{o1}X_1$ twice with outcomes $x_1$, $x_1'$, measuring $X_{o2}X_2$ twice with outcomes $x_2$, $x_2'$, postselecting on consistent outcomes $x_1=x_1'$ and $x_2=x_2'$, and applying $Z_{o1}$ if $x_1=-1$ and $Z_{o2}$ if $x_2=-1$; measuring the X-stabilizers on the n data qubits and postselecting on all +1 outcomes comprises measuring XXXXII and IIXXXX on the six data qubits and postselecting on all +1 outcomes; measuring each data qubit destructively utilizing the Z-stabilizers and applying one or more postselection conditions to the n data qubits to complete the teleportation of the k distilled magic states to the k output qubits comprises measuring individual data qubits destructively in the Z basis to obtain outcomes $z_1, \ldots z_6$ and postselecting on both conditions $z_1z_2z_3z_4=+1$ and $z_3z_4z_5z_6=+1$, and applying $X_{o1}$ if $z_1z_3z_5=-1$ and $X_{o2}$ if $z_2z_4z_6=-1$; and the k distilled magic states comprises 2 T states. In some such examples, the outer code may be a $3^{rd}$ order normal weakly selfdual CSS code by [[7,1,3]], wherein n=7, k=1, and d=3. In such examples, preparing k encoded noisy magic states using n qubits comprises initializing seven data qubits in $|0\rangle^{\otimes 7}$ and bringing $|\tilde{T}\rangle_t$ on a side of a qubit array, measuring three X-stabilizers XIXIXIX IXXIIXX and IIIXXXX on the seven data qubits and applying Z measurements on the six data qubits to obtain logical qubits comprising a logical state with ZZZZZZZ≈+1, and teleporting into the code via measuring $X_tX$ and then measuring $Z_t$, measurement X being logical operator X=$X^{\otimes 7}$; the method further comprises measuring the three X-stabilizers and postselecting on all +1 outcomes; measuring Clifford stabilizers on the n data qubits comprises applying $T^{\otimes 7}$ on the data qubits, measuring $X^{\otimes 7}$ twice on the data qubits and postselecting on all +1 outcomes, and applying $(T^\dagger)^{\otimes 7}$ on the data qubits; initializing k output qubits comprises initializing an output qubit in the state $|0\rangle_o$; initiating teleportation of the k encoded magic states to the k output qubits comprises measuring three equivalent X-logical operators of the code multiplied by the X-operator on the output qubit, $X_o$(IXIXIXI), $X_o$(XIIXXII), $X_o(XXXIIII)$, with outcomes $x_1, x_2, x_3 = \pm 1$, postselecting on consistent results $x = x_1 = x_2 = x_3$, and applying $Z_o$ if $x = -1$; measuring the X-stabilizers on the n data qubits and postselecting on all +1 outcomes comprises measuring the three X-stabilizers and postselecting on all +1 outcomes; measuring each data qubit destructively utilizing the Z-stabilizers and applying one or more postselection conditions to the n data qubits to complete the teleportation of the k distilled magic states to the k output qubits comprises destructively measuring all data qubits in the Z basis to obtain outcomes $z_1, \ldots z_7$ and postselecting on three conditions $z_1 z_3 z_5 z_7 = +1$, $z_2 z_3 z_6 z_7 = +1$, and $z_4 z_5 z_6 z_7 = +1$, applying $X_o$ if $z_1 z_3 z_5 = -1$, and the k distilled magic states comprises one T state. In some such examples, the outer code may be a $2^{nd}$ order triorthogonal CCZ code by [[8,3,2]], wherein n=8, k=3, and d=2. In such examples, preparing k encoded noisy magic states using n qubits comprises initializing eight data qubits in $|\tilde{0}\rangle^{\otimes 8}$, measuring the X-stabilizer XXXXXX on the eight data qubits, measuring three X-logical operators $X_1 = IXIXIXIX$, $X_2 = IIXXIIXX$, $X_3 = IIIIXXXX$, and upon −1 outcomes for any of the X-stabilizer and X-logical operators, applying Pauli corrections by ZIIIIIII and Z-logical operators such that the resulting state is the logical state $|\overline{+++}\rangle$, and measuring IXXIXIIX and postselecting on the +1 outcome; measuring Clifford stabilizers on the n data qubits comprises applying $\tilde{T}^\dagger \otimes \tilde{T} \otimes \tilde{T} \otimes \tilde{T}^\dagger \otimes \tilde{T} \otimes \tilde{T} \otimes \tilde{T}^\dagger \otimes \tilde{T}$ on the data qubits; initializing k output qubits comprises initializing three output qubit in the state $|000\rangle_{o1,o2,o3}$; initiating teleportation of the k encoded magic states to the k output qubits comprises measuring $X_{o1} X_1$ twice with outcomes $x_1, x_1'$, measuring $X_{o2} X_2$ twice with outcomes $x_2, x_2'$, measuring $X_{o3} X_3$ twice with outcomes $x_3, x_3'$, postselecting on consistent outcomes $x_1 = x_1'$, $x_2 = x_2'$, $x_3 = x_3'$, applying $Z_{o1}$ if $x_1 = -1$, applying $Z_{o2}$ if $x_2 = -1$, and applying $Z_{o3}$ if $x_3 = -1$; measuring the X-stabilizers on the n data qubits and postselecting on all +1 outcomes comprises measuring the X-stabilizer $X^{\otimes 8}$ on the data qubits and postselecting on a +1 outcome; measuring each data qubit destructively utilizing the Z-stabilizers and applying one or more postselection conditions to the n data qubits to complete the teleportation of the k distilled magic states to the k output qubits comprises destructively measuring all data qubits in the Z basis to obtain outcomes $Z_1, \ldots, Z_8$ and postselecting on all four conditions $z_1 z_2 z_3 z_4 + 1$, $z_2 z_4 z_6 z_8 + 1$, $z_3 z_4 z_7 z_8 + 1$, and $z_5 z_6 z_7 z_8 + 1$; and the k distilled magic states comprises 3 qubits in a $|CCZ\rangle$ state. In some such examples, applying a Z-measurement and applying an X-measurement each may comprise performing a Pauli frame update. In some such examples, the [[n, k, d]] block code may additionally or alternatively comprise 8n qubits that form a 4×(2n) rectangle with a first row occupied by S states; a second row occupied by T states; a third row occupied by a data qubit of the block code in every other column; and a fourth row reserved for cat state preparation. In some such examples, the method may additionally or alternatively comprise cat state preparation comprising preparing $|00\rangle_{ab}$ and measuring $X_a X_b$ with a Pauli correction to have $|00\rangle_{ab} + |11\rangle_{ab}$, shrinking b to match the size of the patches in the fourth row of the 4×(2n−1) rectangle, and sufficiently measuring ZZ between nearest neighbors in the fourth row and discarding every other qubit; preparing k encoded noisy magic states using n data qubits may comprise multiqubit Pauli operations; initiating teleportation of the k encoded magic states to the k output qubits may comprise multiqubit Pauli operations; and multiqubit Pauli operations may be performed via cat states. In some such examples, the inner code may additionally or alternatively be configured to operate in error-detecting mode and the method may comprise post-selecting based on the Clifford stabilizer measurement. In some such examples, the inner code may additionally or alternatively be configured to operate in in partial error correcting mode and the method may comprise determining a weight of an error associated with a Clifford stabilizer measurement, for a smaller-weight error, correcting the error, and for a higher-weight error, postselecting based on the error and thereby not using the k distilled magic states in a quantum computation. In some such examples, preparing k encoded noisy magic states using n data qubits may comprise injecting T states via horizontal ZZ measurements and single qubit X measurements, thereby teleporting the T state to a qubit horizontally adjacent to a data qubit. In some such examples, the output may additionally or alternatively include k+2 output qubits comprising k magic states of higher quality and 2 ancillas.

Another example provides a quantum computer comprising a qubit register including a plurality of qubits; a modulator configured to implement one or more quantum-logic operations on the plurality of qubits; a demodulator configured to output data exposing a quantum state of the plurality of qubits; a controller operatively coupled to the modulator and to the demodulator; and computer memory holding instructions that cause the controller to, within a [[n,k,d]] block code, prepare k encoded noisy magic states using n data qubits of the plurality of qubits; measure Clifford stabilizers on the n data qubits; initialize k output qubits of the plurality of qubits; initiate a teleportation of k encoded magic states derived from the k encoded magic states to the k output qubits; measure the X-stabilizers on the n data qubits and postselect on all +1 outcomes; measure each data qubit destructively utilizing the Z-stabilizers and apply one or more postselection conditions to the n data qubits to complete the teleportation of the k distilled magic states to the k output qubits; and use the k distilled magic states in a quantum computation. In some such examples, the k distilled magic states may comprise one or more T states. In some such examples, the k distilled magic states may additionally or alternatively comprise three qubits in a CCZ state. In some such examples, the [[n, k, d]] block code may additionally or alternatively comprise 8n qubits of the plurality of qubits forming a 4-by-2n rectangle comprising a first row occupied by S states, a second row occupied by T states, a third row occupied by a data qubit in every other column, and a fourth row reserved for cat state preparation. In some such examples, the quantum computer may additionally or alternatively be a topological quantum computer. In some such examples, the quantum computer may additionally or alternatively comprise Majorana wires and the plurality of qubits may be Majorana fermions within the Majorana wires.

Another example provides, on a quantum computer, a method for distilling magic states encoded in a [[n,k,d]] block code comprising an outer code, the method comprising initializing n data qubits in an array of data qubits; bringing k noisy magic states to a side of the array of data qubits; performing stabilizer measurements on the k data qubits; performing one or more logical operator measurements on the k noisy magic states and n data qubits, thus teleporting the states of the k noisy magic states to k encoded magic states; performing one or more Clifford stabilizer measurements on the n data qubits, thereby applying an inner error correcting code to the n data qubits; initializing k output qubits; initiating a teleportation of the k encoded magic states to the k output qubits; performing X-stabilizer measurements on the n data qubits; performing destructive Z-stabilizer measurements on the data qubits to complete the teleportation of the k encoded magic states to the k output qubits, the k output qubits now comprising k distilled magic states; and using the k distilled magic states in a quantum computation. In some such examples, the k noisy magic states may be k noisy T states; the k encoded magic states may be k encoded T states; and the k distilled magic states may be k higher-fidelity T states. In some such examples, the k noisy magic states may be k noisy CCZ states, the k encoded magic states are k encoded T states, and the k distilled magic states may be k higher-fidelity CCZ states.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. On a quantum computing device, a method for distilling magic states encoded in a [[n,k,d]] block code comprising an outer code, the method comprising:
preparing k encoded noisy magic states using n data qubits;
measuring Clifford stabilizers on the n data qubits, thereby applying an inner error correcting code to the n data qubits;
initializing k output qubits;
initiating a teleportation of k distilled magic states derived from the k encoded noisy magic states to the k output qubits;
measuring the X-stabilizers on the n data qubits and postselecting on all +1 outcomes;
measuring each data qubit destructively utilizing the Z-stabilizers and applying one or more postselection conditions to the n data qubits to complete the teleportation of the k distilled magic states to the k output qubits; and
using the k distilled magic states in a quantum computation.

2. The method of claim 1, wherein the outer code is a $2^{nd}$ order normal weakly selfdual CSS code by, [[6,6,2]], wherein n=6, k=2, and d=2;
wherein preparing k encoded noisy magic states using n qubits comprises 1) initializing six data qubits in $|\overline{0}\rangle^{\otimes 6} |\tilde{T}\rangle_{t1}$ and $|\tilde{T}\rangle_{t2}$ on a side of a qubit array,
2) measuring XXXXII and IIXXXX on the six data qubits and applying Z measurements on the six data qubits to obtain logical qubits comprising a logical state with ZIZIZI≈IZIZIZ≈+1, and
3) teleporting states in qubits t1, t2 into the logical qubits via measuring $X_{t1}X_1$, $X_{t2}X_2$ and then measuring $Z_{t1}$, $Z_{t2}$ followed by Pauli Z corrections on the logical qubits, the Pauli Z corrections based upon the $X_{t1}X_1$, $X_{t2}X_2$ and $Z_{t1}$, $Z_{t2}$ measurements, $X_1$ and $X_1$ being logical operators $X_1$=XIXIXI and $X_2$=IXIXIX;

wherein measuring Clifford stabilizers on the n data qubits comprises
4) applying $T^{\otimes 6}$ on the data qubits,
5) measuring $X^{\otimes 6}$ twice on the data qubits and postselecting on all +1 outcomes, and
6) applying $(T^\dagger)^{\otimes 6}$ on the data qubits;
wherein initializing k output qubits comprises 7) initializing two output qubits o1, o2 in $|0\rangle^{\otimes 2}$;
wherein initiating teleportation of the k encoded magic states to the k output qubits comprises
8) measuring $X_{o1}X_1$ twice with outcomes $x_1, x_1'$, measuring $X_{o2}X_2$ twice with outcomes $x_2, x_2'$, postselecting on consistent outcomes $x_1=x_1'$ and $x_2=x_2'$, and
applying $Z_{o1}$ if $x_1=-1$ and $Z_{o2}$ if $x_2=-1$;
wherein measuring the X-stabilizers on the n data qubits and postselecting on all +1 outcomes comprises
9) measuring XXXXII and IIXXXX on the six data qubits and postselecting on all +1 outcomes;
wherein measuring each data qubit destructively utilizing the Z-stabilizers and applying one or more postselection conditions to the n data qubits to complete the teleportation of the k distilled magic states to the k output qubits comprises
10) measuring individual data qubits destructively in the Z basis to obtain outcomes $z_1, \ldots z_6$ and postselecting on both conditions $z_1z_2z_3z_4=+1$ and $z_3z_4z_5z_6=+1$, and
applying $X_{o1}$ if $z_1z_3z_5=-1$ and $X_{o2}$ if $z_2z_4z_6=-1$; and
wherein the k distilled magic states comprises 2 T states.

3. The method of claim 1, wherein the outer code is a $3^{rd}$ order normal weakly selfdual CSS code by [[7,1,3]], wherein n=7, k=1, and d=3;
wherein preparing k encoded noisy magic states using n qubits comprises 1) initializing seven data qubits in $|\overline{0}\rangle^{\otimes 7}$ and bringing $|\tilde{T}\rangle_t$ on a side of a qubit array,
2) measuring three X-stabilizers XIXIXIX, IXXIIXX and IIIXXXX on the seven data qubits and applying Z measurements on the six data qubits to obtain logical qubits comprising a logical state with ZZZZZZZ≈+1, and
3) teleporting into the code via measuring $X_tX$ and then measuring $Z_t$, measurement X being logical operator $X=X^{\otimes 7}$;
further comprising
4) measuring the three X-stabilizers and postselecting on all +1 outcomes;
wherein measuring Clifford stabilizers on the n data qubits comprises
5) applying $T^{\otimes 7}$ on the data qubits,
6) measuring $X^{\otimes 7}$ twice on the data qubits and postselecting on all +1 outcomes, and
7) applying $(T^\dagger)^{\otimes 7}$ on the data qubits;
wherein initializing k output qubits comprises 8) initializing an output qubit in the state $|0\rangle_o$;
wherein initiating teleportation of the k encoded magic states to the k output qubits comprises
9) measuring three equivalent X-logical operators of the code multiplied by the X-operator on the output qubit, $X_o$ (IXIXIXI), $X_o$ (XXXIIII), $X_o$ (XXXIIII), with outcomes $x_1, x_2, x_3=\pm 1$,
postselecting on consistent results $x=x_1=x_2=x_3$, and applying $Z_o$ if $x=-1$;

wherein measuring the X-stabilizers on the n data qubits and postselecting on all +1 outcomes comprises
10) measuring the three X-stabilizers and postselecting on all +1 outcomes; and wherein measuring each data qubit destructively utilizing the Z-stabilizers and applying one or more postselection conditions to the n data qubits to complete the teleportation of the k distilled magic states to the k output qubits comprises
11) destructively measuring all data qubits in the Z basis to obtain outcomes $z_1, \ldots z_7$ and postselecting on three conditions $z_1 z_3 z_5 z_7 = +1$, $z_2 z_3 z_6 z_7 = +1$, and $z_4 z_5 z_6 z_7 = +1$,
applying $X_o$ if $z_1 z_3 z_5 = -1$, and
wherein the k distilled magic states comprises one T state.

4. The method of claim 1, wherein the outer code is a $2^{nd}$ order triorthogonal CCZ code by, [[8,3,2]], wherein n=8, k=3, and d=2;
wherein preparing k encoded noisy magic states using n qubits comprises
1) initializing eight data qubits in $|\tilde{0}\rangle^{\otimes 8}$,
2) measuring the X-stabilizer XXXXXXXX on the eight data qubits,
measuring three X-logical operators $X_1$=IXIXIXIX, $X_2$=IIXXIIXX, $X_3$=IIIIXXXX, and
upon −1 outcomes for any of the X-stabilizer and X-logical operators, applying Pauli corrections by ZIIIIIII and Z-logical operators such that the resulting state is the logical state $|\tilde{+}\tilde{+}\tilde{+}\rangle$, and
3) measuring IXXIXIIX and postselecting on the +1 outcome;
wherein measuring Clifford stabilizers on the n data qubits comprises
4) applying $\tilde{T}^\dagger \otimes \tilde{T} \otimes \tilde{T} \otimes \tilde{T}^\dagger \otimes \tilde{T} \otimes \tilde{T} \otimes \tilde{T}^\dagger \tilde{T}^\dagger \otimes \tilde{T}$ on the data qubits;
wherein initializing k output qubits comprises
5) initializing three output qubit in the state $|000\rangle_{o1,o2,o3}$;
wherein initiating teleportation of the k encoded magic states to the k output qubits comprises
6) measuring $X_{o1} X_1$ twice with outcomes $x_1, x_1'$,
measuring $X_{o2} X_2$ twice with outcomes $x_2, x_2'$,
measuring $X_{o3} X_3$ twice with outcomes $x_3, x_3'$,
postselecting on consistent outcomes $x_1 = x_1'$, $x_2 = x_2'$, $x_3 = x_3'$,
applying $Z_{o1}$ if $x_1 = -1$,
applying $Z_{o2}$ if $x_2 = -1$, and
applying $Z_{o3}$ if $x_3 = -1$;
wherein measuring the X-stabilizers on the n data qubits and postselecting on all +1 outcomes comprises
7) measuring the X-stabilizer $X^{\otimes 8}$ on the data qubits and postselecting on a +1 outcome;
wherein measuring each data qubit destructively utilizing the Z-stabilizers and applying one or more postselection conditions to the n data qubits to complete the teleportation of the k distilled magic states to the k output qubits comprises
8) destructively measuring all data qubits in the Z basis to obtain outcomes $z_1, \ldots, z_8$ and postselecting on all four conditions $z_1 z_2 z_3 z_4 = +1$, $z_2 z_4 z_6 z_8 = +1$, $z_3 z_4 z_7 z_8 = +1$, and $z_5 z_6 z_7 z_8 = +1$; and
wherein the k distilled magic states comprises 3 qubits in a $|CCZ\rangle$ state.

5. The method of claim 1, wherein applying a Z-measurement and applying an X-measurement each comprise performing a Pauli frame update.

6. The method of claim 1, wherein the [[n,k,d]] block code comprises 8n qubits that form a 4×(2n) rectangle with a first row occupied by S states; a second row occupied by T states; a third row occupied by a data qubit of the block code in every other column; and a fourth row reserved for cat state preparation.

7. The method of claim 1 further comprising cat state preparation comprising:
1) preparing $|00\rangle_{ab}$ and measuring $x_a x_b$ with a Pauli correction to have $|00\rangle_{ab} + |11\rangle_{ab}$,
2) shrinking b to match the size of the patches in the fourth row of the 4×(2n −1) rectangle, and
3) sufficiently measuring ZZ between nearest neighbors in the fourth row and discarding every other qubit;
wherein preparing k encoded noisy magic states using n data qubits comprises multiqubit Pauli operations;
wherein initiating teleportation of the k encoded magic states to the k output qubits comprises multiqubit Pauli operations; and
wherein multiqubit Pauli operations are performed via cat states.

8. The method of claim 1, wherein the inner code is configured to operate in error-detecting mode and wherein the method further comprises post-selecting based on the Clifford stabilizer measurement.

9. The method of claim 1, wherein the inner code is configured to operate in in partial error correcting mode and wherein the method further comprises
determining a weight of an error associated with a Clifford stabilizer measurement;
for a smaller-weight error, correcting the error; and
for a higher-weight error, postselecting based on the error and thereby not using the k distilled magic states in a quantum computation.

10. The method of claim 1, wherein preparing k encoded noisy magic states using n data qubits comprises injecting T states via horizontal ZZ measurements and single qubit X measurements, thereby teleporting the T state to a qubit horizontally adjacent to a data qubit.

11. The method of claim 1, wherein the output includes k+2 output qubits comprising k magic states of higher quality and 2 ancillas.

12. A quantum computer comprising:
a qubit register including a plurality of qubits;
a modulator configured to implement one or more quantum-logic operations on the plurality of qubits;
a demodulator configured to output data exposing a quantum state of the plurality of qubits;
a controller operatively coupled to the modulator and to the demodulator; and
computer memory holding instructions that cause the controller to:
within a [[n,k,d]] block code, prepare k encoded noisy magic states using n data qubits of the plurality of qubits;
measure Clifford stabilizers on the n data qubits;
initialize k output qubits of the plurality of qubits;
initiate a teleportation of k encoded magic states derived from the k encoded magic states to the k output qubits;
measure the X-stabilizers on the n data qubits and postselect on all +1 outcomes;
measure each data qubit destructively utilizing the Z-stabilizers and apply one or more postselection conditions to the n data qubits to complete the teleportation of the k distilled magic states to the k output qubits; and use the k distilled magic states in a quantum computation.

13. The quantum computer of claim 12, wherein the k distilled magic states comprise one or more T states.

14. The quantum computer of claim 13, wherein the quantum computer is a topological quantum computer.

15. The quantum computer of claim 12, wherein the k distilled magic states comprise three qubits in a CCZ state.

16. The quantum computer of claim 12, wherein the [[n,k,d]] block code comprises 8n qubits of the plurality of qubits forming a 4-by-2n rectangle comprising:
a first row occupied by S states,
a second row occupied by T states,
a third row occupied by a data qubit in every other column, and
a fourth row reserved for cat state preparation.

17. The quantum computer of claim 12, further comprising *Majorana* wires and wherein the plurality of qubits are *Majorana* fermions within the *Majorana* wires.

18. On a quantum computer, a method for distilling magic states encoded in a [[n,k,d]] block code comprising an outer code, the method comprising:
initializing n data qubits in an array of data qubits;
bringing k noisy magic states to a side of the array of data qubits;
performing stabilizer measurements on the k data qubits;
performing one or more logical operator measurements on the k noisy magic states and n data qubits, thus teleporting the states of the k noisy magic states to k encoded magic states;
performing one or more Clifford stabilizer measurements on the n data qubits, thereby applying an inner error correcting code to the n data qubits;
initializing k output qubits;
initiating a teleportation of the k encoded magic states to the k output qubits;
performing X-stabilizer measurements on the n data qubits;
performing destructive Z-stabilizer measurements on the data qubits to complete the teleportation of the k encoded magic states to the k output qubits, the k output qubits now comprising k distilled magic states; and
using the k distilled magic states in a quantum computation.

19. The method of claim 18, wherein the k noisy magic states are k noisy T states, wherein the k encoded magic states are k encoded T states, and wherein the k distilled magic states are k higher-fidelity T states.

20. The method of claim 18, wherein the k noisy magic states are k noisy CCZ states, wherein the k encoded magic states are k encoded T states, and wherein the k distilled magic states are k higher-fidelity CCZ states.

* * * * *